(12) United States Patent
Konno

(10) Patent No.: US 7,187,243 B2
(45) Date of Patent: Mar. 6, 2007

(54) DELAY CIRCUIT

(75) Inventor: Yoshiaki Konno, Isehara (JP)

(73) Assignee: Asahi Kasei Microsystems Co. Ltd., Tokyo (JP)

( * ) Notice: Subject to any disclaimer, the term of this patent is extended or adjusted under 35 U.S.C. 154(b) by 95 days.

(21) Appl. No.: 11/156,040

(22) Filed: Jun. 17, 2005

(65) Prior Publication Data

US 2006/0284691 A1   Dec. 21, 2006

(51) Int. Cl.
*H03B 5/24*   (2006.01)
*H03H 11/20*   (2006.01)
*H03K 5/14*   (2006.01)

(52) U.S. Cl. .................. 331/57; 327/237; 327/246; 327/250; 327/252

(58) Field of Classification Search .......... 331/57; 327/237, 246, 250, 252
See application file for complete search history.

(56) References Cited

U.S. PATENT DOCUMENTS 7,109,775 B2 * 9/2006 Tomita ................. 327/278

OTHER PUBLICATIONS

Young, Ian .A. et al., "A PLL Clock Generator with 5 to 110 MHz of Lock Range for Microprocessors," IEEE Journal of Solid-State Circuits, vol. 27, No. 11, Nov. 1992, pp. 1599-1607.
Lin, Tsung-Hsien et al, "A 900-MHz 2.5-mA CMOS Frequency Synthesizer with an Automatic SC Tuning Loop," IEEE Journal of Solid-State Circuits, vol. 36, No. 3, Mar. 2001, pp. 424-431.

* cited by examiner

*Primary Examiner*—David Mis
(74) *Attorney, Agent, or Firm*—Finnegan, Henderson, Farabow, Garrett & Dunner LLP

(57) ABSTRACT

A delay circuit according to embodiments of the present invention capable of operating over a wide range of frequencies is presented. Embodiments of the invention minimize or eliminate parasitic capacitance at the output terminals that arise from switching elements used to selectively add capacitive elements to the circuit to vary the operating frequency range.

A ring oscillator using embodiments of the delay circuit according to the present invention is also presented. A sequence of an integral number of delay circuits according to the present invention is coupled in series to form a ring oscillator.

In some embodiments the delay circuit or a ring oscillator incorporating the delay circuit may be fabricated as an integrated circuit.

30 Claims, 6 Drawing Sheets

DELAY CIRCUIT

BACKGROUND

1. Field of the Invention

The present invention relates to a delay circuit incorporating a capacitive element and, in particular, it relates to a delay circuit suitable for ring oscillators and to oscillators incorporating the delay circuit.

2. Description of Related Art

A delay circuit produces an output signal that is delayed with respect to the input signal. Many delay devices typically use Resistor-Capacitor ("RC") circuits, where the delay is adjusted by varying a resistive and/or a capacitive load. In an integrated circuit using field effect transistors, such as MOS (Metal Oxide Semiconductor) transistors, the resistive and capacitive loads may be provided by transistors. Delay circuits are used in ring oscillators, which are important components of Phase-Locked Loop ("PLL") circuits that have wide applications in the electronics world.

A ring oscillator is a circuit composed of a plurality of delay circuits that are coupled to form a ring. The ring oscillator achieves oscillation by inverting its input signal upon ring-traversal and delaying its output in response to the input. The amount of time required for an input signal to traverse the ring is determined by the sum of the individual delays of the delay circuits that form the ring. Thus, the period of oscillation of the ring oscillator can be controlled by varying the delays of its individual constituent delay circuits.

Ring oscillators are often used in phase-locked loop ("PLL") circuits. In a phase-locked loop, an oscillator whose frequency and/or phase can be varied is synchronized in phase and/or frequency with a reference source. Therefore, the oscillator operates over a range of frequencies so that its frequency may be altered to match that of the reference source. The use of delay circuits in oscillators for PLLs is well known. See, for example, Ian A. Young "A PLL Clock Generator with 5 to 110 MHz of Lock Range for Microprocessors", IEEE Journal Of Solid-State Circuits, Vol. 27, No. 11, November 1992; pp. 1599–1607 ("Young"); or Tsung-Hsien Lin, "A 900-MHz 2.5-mA CMOS Frequency Synthesizer with an Automatic SC Tuning Loop", IEEE Journal Solid-State Circuits, Vol. 36, No. 3, March 2001, pp. 424–431 ("Lin"), each of which is herein incorporated by reference in their entirety.

For conventional delay circuits, delay length is typically varied by changing the bias voltage of a MOS transistor in the circuit. Changing the bias voltage causes a variation in the current through the transistor, or the resistance of the transistor. However, the range of variation of the current through the transistor, or of the resistance of the transistor, is limited because of restrictions on the range of bias voltages. Therefore, in order to expand the range by which delay lengths can be varied, the capacitance value of capacitors in delay circuits is also varied.

Variation in the capacitance values is generally accomplished through the use of switching elements. This has the unfortunate consequence of introducing the parasitic capacitance of the switching elements into the delay circuit leading to an increase in the minimum value of delay length. As a result, the upper limit of the oscillation frequency of a ring oscillator incorporating such a delay circuit is reduced.

There is thus a need for delay circuits in which the delay length may be varied over a wide range without effects introduced by the parasitic capacitances of switching elements. The successful incorporation of such delay circuits into ring oscillators would also allow ring oscillators to operate over a greater range of frequencies.

SUMMARY

Embodiments of a delay circuit capable of operating over a wide range of frequencies are presented. In some embodiments, the delay circuit includes a capacitor bank including a first capacitor, and one or more additional capacitors capable of being coupled in parallel with the first capacitor; a first switching configuration to selectively enable one of two or more transistors coupled in series; and a second switching configuration to charge or discharge the first capacitor and/or one of the other capacitors using one of the two transistors in accordance with an input signal. In some embodiments according to the present invention, the first capacitor is used when the first switching configuration enables one of the transistors, while the first capacitor and at least one of the other capacitors coupled in parallel are used when the first switching configuration selects one of the other transistors. In some embodiments according to the present invention, the means used to selectively enable one of the transistors does not load the output and permits a wide operational frequency range for the delay circuit. In some embodiments, the transistors may serve as resistors or current sources.

In some embodiments the delay circuit may be fabricated as an integrated circuit. In some embodiments, the delay circuit may be a functional element of a larger component that is fabricated as an integrated circuit.

Embodiment of a ring oscillator using embodiments of the delay circuit according to the present invention is also presented. A sequence of an integral number of delay circuits according to the present invention is coupled in series to form an oscillator, wherein the output of each delay circuit is fed to the next delay circuit in sequence and the output of the last delay circuit in the sequence is fed back to the first delay circuit in the sequence.

In some embodiments the oscillator may be fabricated as an integrated circuit. In some embodiments, the oscillator may be a functional element of a larger component that is fabricated as an integrated circuit.

DETAILED DESCRIPTION

A conventional delay circuit incorporates elements such as a current source, a resistor, and a capacitor with the delay being controlled by varying the values of one or more of the current, resistance, and capacitance. The capacitance value may be varied by using a plurality of switches and capacitors, with the switches serving to add or remove capacitors from the circuit.

Figure 1:
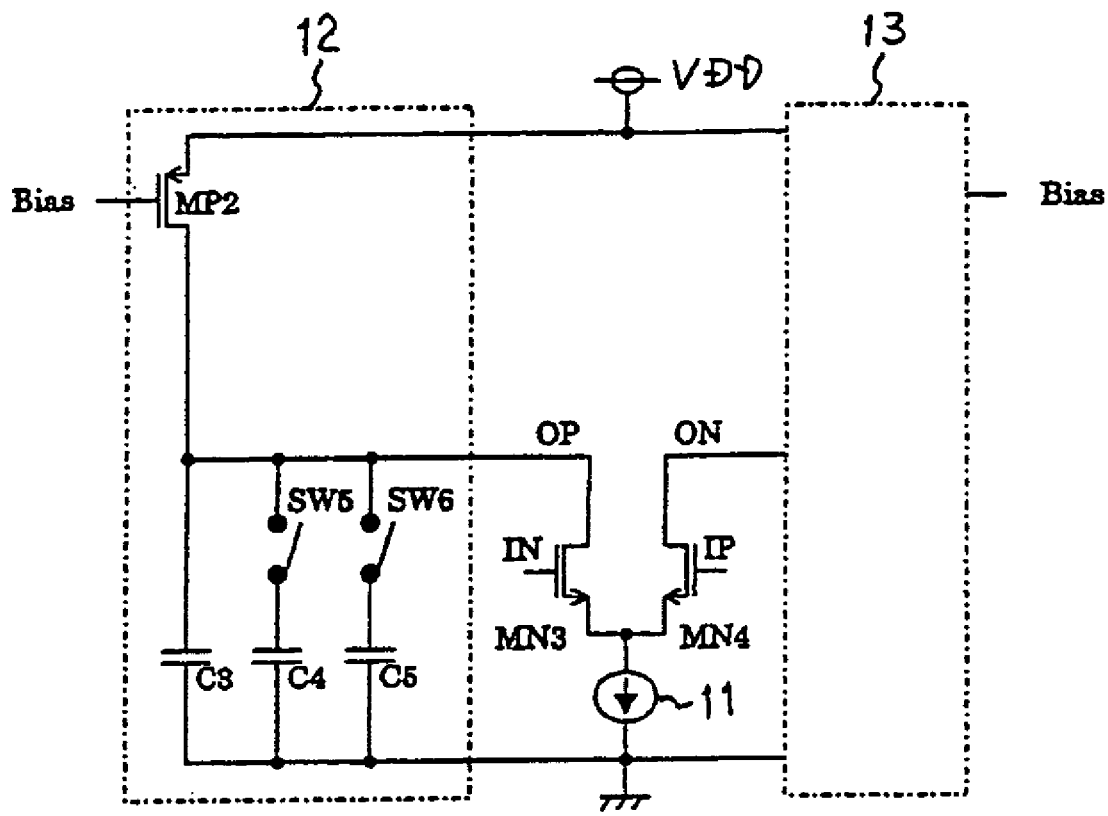
FIG. 1 shows a circuit diagram showing an arrangement of a conventional delay circuit.

The delay circuit shown in FIG. 1 illustrates a conventional differential delay circuit and includes MOS transistors MN3 and MN4, which form a differential pair, a current source 11, and a pair of delay setting sections 12 and 13 for setting the length of the delay. MOS transistors MN3 and MN4 are supplied with inputs IN and IP at their respective gates, and provide outputs OP and ON at their respective drains. Delay setting section 12 includes P-type MOS transistor MP2, capacitors C3–C5, and switches SW5 and SW6. Delay setting section 13 can be arranged in the same manner as delay setting section 12, although the various individual elements have not been shown in FIG. 1.

In FIG. 1, the resistance of MOS transistor MP2 is controlled by bias voltage "Bias" applied to the gate. If input voltage IN at the gate of MOS transistor MN3 is greater than input IP to MOS transistor MN4, an electrical current flows from MP2 to MN3. Consequently, the output voltage OP of MN3 decreases, and the output voltage ON of MN4 increases. On the other hand, if input voltage IP is greater than input voltage IN, current flow to MN3 is stopped. Consequently, output voltage OP increases, and output voltage ON decreases.

Figure 3:
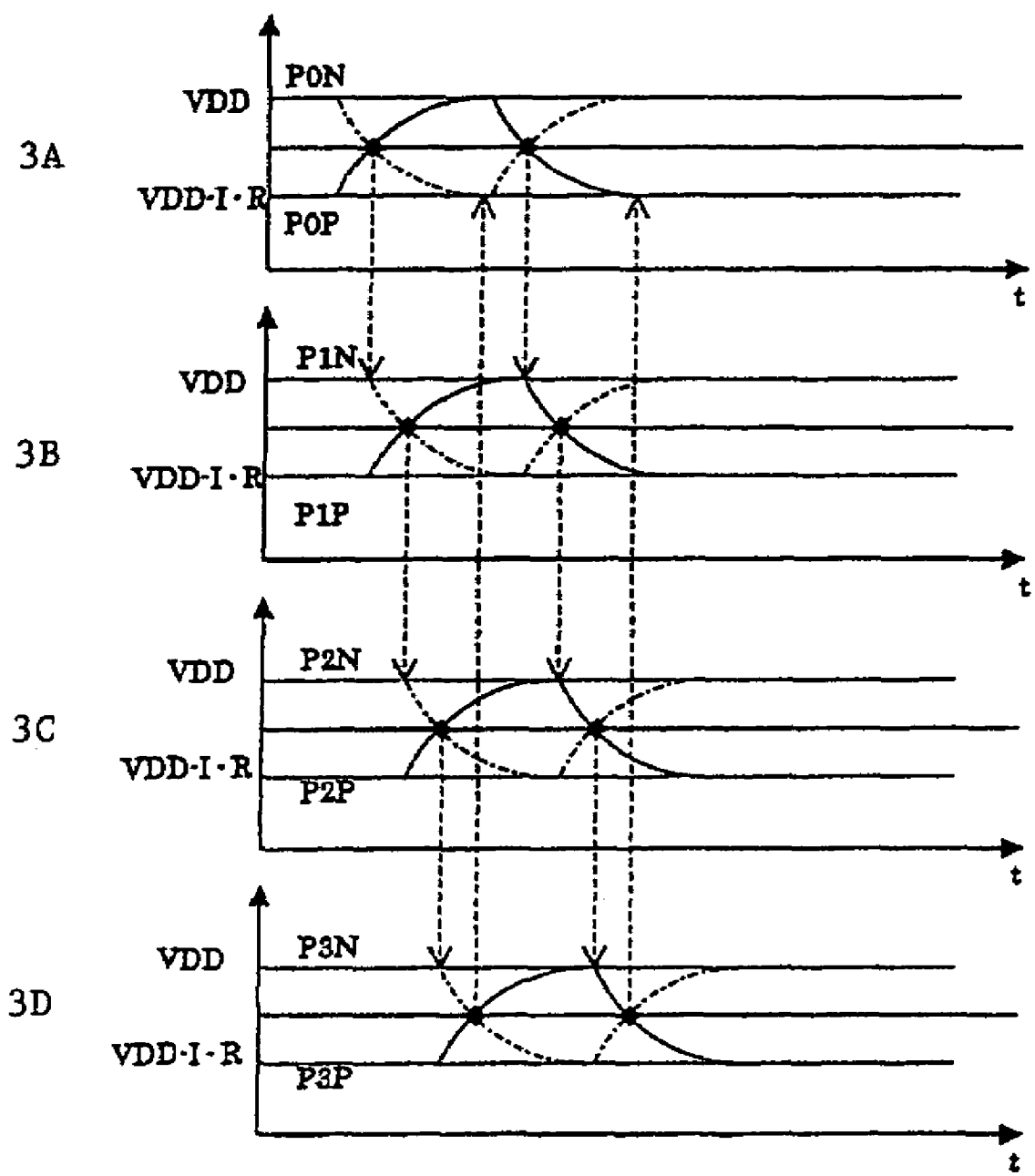
FIG. 3 illustrates the operation of the ring oscillator of FIG. 2.

FIG. 3A shows output voltage variations of outputs OP and ON of MOS transistors MN3 and MN4. Note that, outputs OP and ON correspond to "P0P" and "P0N", respectively, in FIG. 3A. The mathematical relationship of the output voltages P0P and P0N with circuit elements may be expressed by the equations (1) and (2) respectively.

$$P0P = VDD - I^*R^*\exp\{-t/(R^*C)\} \quad (1)$$

$$P0N = VDD - I^*R^*(1-\exp\{-t/(R^*C)\}) \quad (2)$$

In equations 1 and 2, "VDD" denotes the voltage of the power supply, "R" denotes the resistance of MOS transistor MP2, "C" denotes the capacitance added to drain terminals of MOS transistors MN3 and MN4, and "t" denotes the elapsed time. Capacitance value C described above refers to the capacitance value of the capacitor C3 if the switches SW5 and SW6 are both off. If switch SW5 is on and switch SW6 is off, then C refers to the sum of the capacitances of C3 and C4. If switches SW5 and SW6 are both on, then C is the sum of the capacitances C3, C4, and C5.

Note that potentials P0P and P0N of the delay circuit shown in FIG. 1 behave as shown in FIG. 3(A). Output voltage P0P increases from voltage (VDD−I·R), whereas the output voltage P0N decreases from the power supply voltage VDD, with P0P=P0N at the point of intersection of the lines denoting P0P and P0N.

Figure 2:
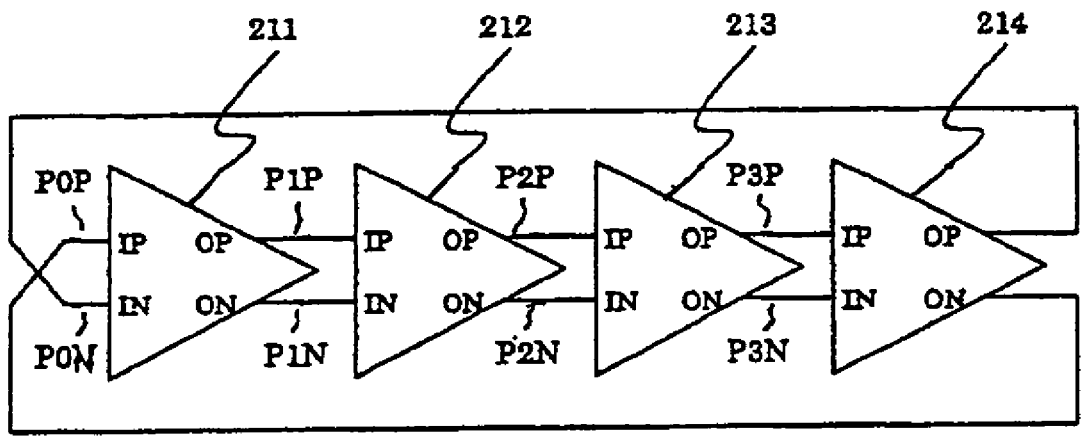
FIG. 2 shows a diagram showing an arrangement of a ring oscillator incorporating the conventional circuit of FIG. 1.

FIG. 2 shows a ring oscillator that includes four delay circuits of the type shown in FIG. 1 coupled in a ring. Specifically, the ring oscillator includes four cascaded delay circuits 211–214 with the output signals of the back-end delay circuit 214 P0P and P0N being fed back as input signals to the front-end delay circuit 211. Likewise, the output signals P1P and P1N of delay circuit 211 are fed as input signals to delay circuit 212; output signals P2P and P2N of circuit 212 are fed as input signals to delay circuit 213; and output signals P3P and P3N of delay circuit 213 are fed as input signals to delay circuit 214. The relative variations of the output signals of delay circuits 211–214 with respect to each other are shown in FIGS. 3(A)–3(D) respectively.

As shown in FIG. 3(A), input voltage P0P of delay circuits 211 increases from a voltage of (VDD−I·R), while input voltage P0N decreases from the power supply voltage VDD. At the point in time where the graphs denoting P0P and P0N intersect, P0P=P0N and voltages P0P and P0N are equal.

As shown in FIG. 3(B), from the point in time at which its input voltages P0P and P0N are equal (i.e. when P0P=P0N), output voltage P1P of delay circuit 211 starts to increase from (VDD−I·R), while output voltage P1N of the delay circuit 211 starts to decrease from voltage VDD. As before, output voltage P1P=P1N when lines denoting voltages P1P and P1N intersect.

Similarly, FIG. 3(C) shows output voltage P2P of the delay circuit 212 increasing from voltage (VDD−I·R), while output voltage P2N starts decreasing from VDD, starting from the time at which input voltages P1P and P1N are equal. Again, intersection of the lines denoting P2P and P2N indicate that the output voltages of delay circuit 212 are equal, i.e. P2P=P2N.

FIG. 3(D) shows output voltage P3P of delay circuit 213 increasing from voltage (VDD−I·R), whereas output voltage P3N decreases from voltage VDD, from the time when input voltages P2P and P2N of delay circuit 213 are equal. Voltage P3P=P3N when lines representing voltages P3P and P3N intersect.

Note that when the input voltages P3P and P3N are equal, output voltages P0P and P0N of delay circuit 214 (representing the input voltages to circuit 211) are at voltage VDD and the voltage (VDD−I·R) respectively. Thereafter, output voltage P0P decreases toward voltage (VDD−I·R), while output voltage P0N increases toward voltage VDD, and the lines intersect when P0P=P0N.

If the input voltages for a given circuit are equal at time t=0, then the time $T_D$ at which the output voltages become equal is given by equating output voltages expressed by equations (1) and (2). Therefore, $$VDD - I^*R^*\exp\{-T_D/(R^*C)\} = VDD - I^*R(1-\exp\{-T_D/RC\}), \quad (3)$$

which yields, $$\exp\{-T_D/(R^*C)\} = (1/2), \quad (4)$$

implying that $$T_D = -(R/C)\log_e(1/2). \quad (5)$$

In general, the time period TD of the ring oscillator is determined by the propagation time of a single transition through the complete chain, or $T = 2^*T_D^*N$, where N is the number of cascaded delays circuits in the ring. For the ring oscillator shown in FIG. 3, the number of delay cascaded delay circuits is 4, i.e. N=4. The factor 2 results from the observation that a full cycle requires both a low-to-high and a high-to-low transition. Thus, the ring oscillator shown in FIG. 2, has a period given by $8^*T_D$ and oscillates with a period of $8^*T_D$.

Time $T_D$ is proportional to R and to C as indicated by equation (5). Thus, the oscillation period of the ring oscillator shown in FIG. 2 can be varied by varying the resistance value of the MOS transistor MP2, or by varying the sum of capacitance values of the capacitors C3–C5.

Figure 4:
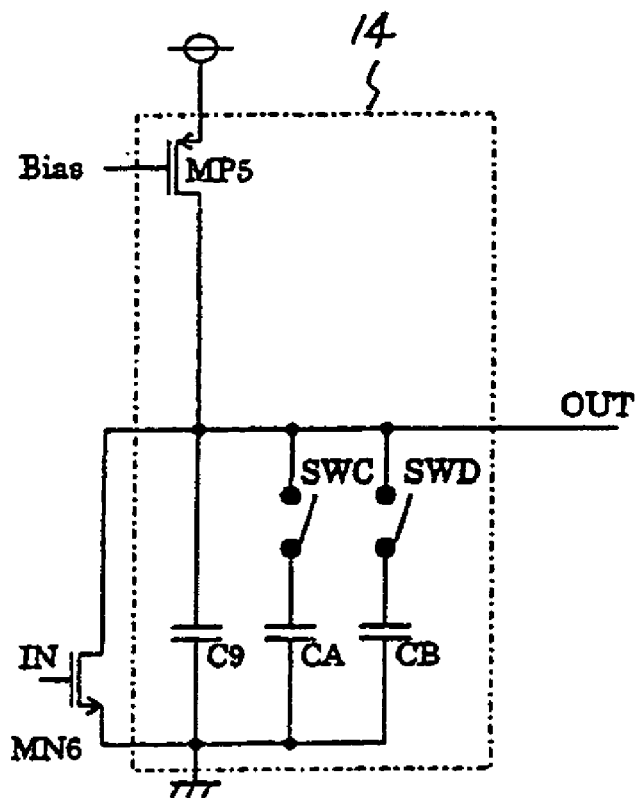
FIG. 4 shows a circuit diagram showing an arrangement of another conventional delay circuit.

FIG. 4 shows another example of a single-ended conventional delay circuit comprising of a MOS transistor MN 6 and a delay setting section 14 for setting the length of delay. MOS transistor MN6 is supplied with an input IN at its gate and provides an output OUT at its drain. Delay setting section 14 includes a P-type MOS transistor MP5, capacitors C9, CA and CB, and switches SWC and SWD.

Figure 6:
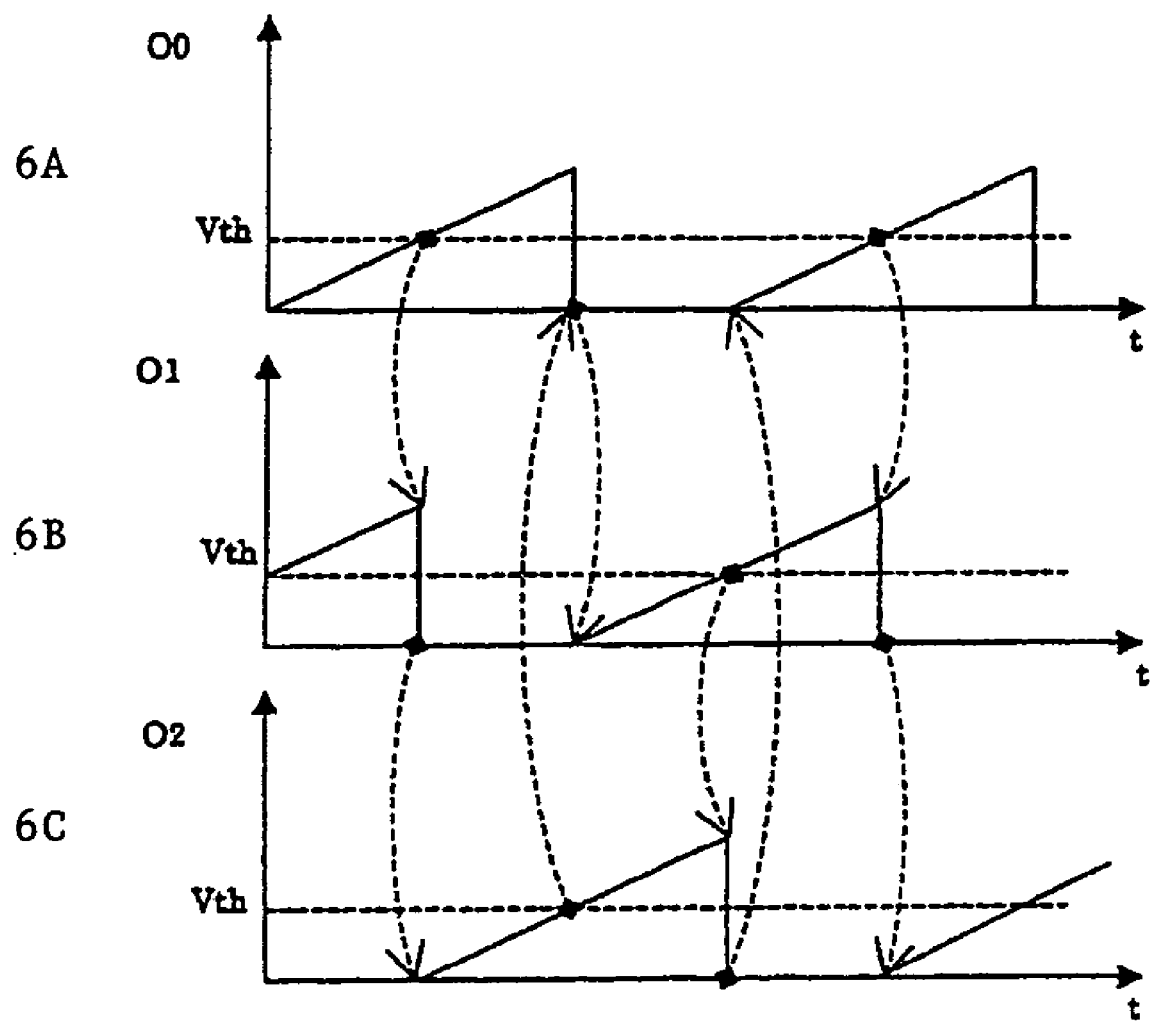
FIG. 6 graphically illustrates the operation of the ring oscillator of FIG. 5.

As shown in FIG. 4, MOS transistor MP5 controls the current value through a bias voltage "Bias" applied to its gate. If input voltage IN at the gate of MOS transistor MN6 exceeds its threshold voltage $V_{TH}$, then MOS transistor MN6 is turned on, and output voltage OUT decreases. On the other hand, if input voltage IN is lower than threshold voltage $V_{TH}$, then MOS transistor MN6 is turned off, and output voltage OUT increases. Variations in output voltage OUT depend on the current through MOS transistor MP5, and the capacitance of capacitor C9 and are shown in FIG. 6(A). The output potential V can be expressed by the following equation:

$$V = (I/C) \cdot t. \qquad (6)$$

In the formula above, "I" denotes the value of the current through the MOS transistor MP5, "C" denotes the value of the capacitance added to the output line, and "t" denotes the elapsed time.

Figure 5:
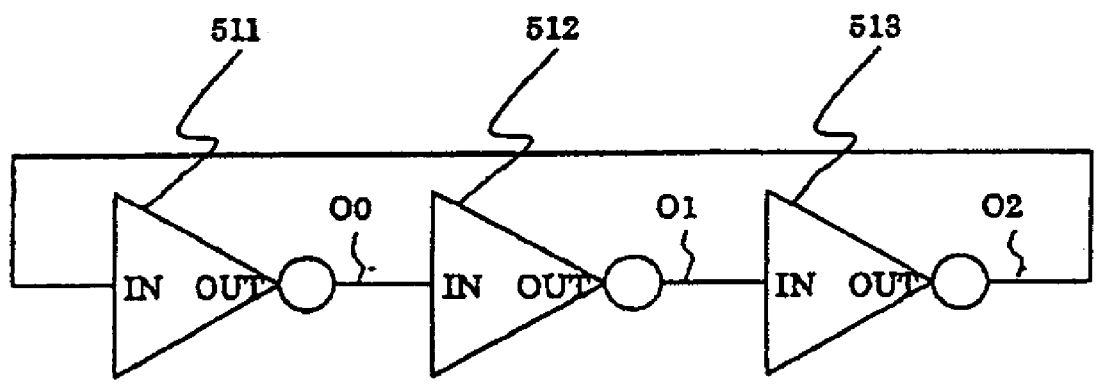
FIG. 5 shows a diagram showing an arrangement of a ring oscillator incorporating the conventional circuit of FIG. 4.

FIG. 5 shows a ring oscillator comprising three delay circuits of the type shown in FIG. 4 coupled in a ring. Specifically, the ring oscillator includes three cascaded delay circuits 511–513 with the output signal of back-end delay circuit 513 being fed back to be the input signal of front-end delay circuit 511.

As shown in FIG. 6(A), the output voltage O0 of delay circuit 511 increases from 0 and reaches threshold voltage $V_{TH}$. At this point in time, the output voltage O1 of the delay circuit 512 drops to 0, as shown in FIG. 6(B), while output voltage O2 of delay circuit 513 starts increasing from 0, as shown in FIG. 6(C).

Next, when output voltage O2 of the delay circuit 513 reaches threshold voltage $V_{TH}$, as shown in FIG. 6(C), the output potential O0 of the delay circuit 511 drops to 0, as shown in FIG. 6(A), while the output potential 1 of the delay circuit 512 starts increasing from 0, as shown in FIG. 6(B).

Finally, when output voltage O1 of delay circuit 512 reaches threshold voltage $V_{TH}$ as shown in FIG. 6(B), output potential O2 of delay circuit 513 drops to 0, as shown in FIG. 6(C), while output potential O0 of delay circuit 511 starts increasing from 0, as shown in FIG. 6(A).

This sequence of increasing and decreasing output voltages continues for each delay circuit in the ring oscillator. Here, the time $T_D$ representing the time taken from the point in time when the input potential of each delay circuit drops to 0 (i.e. the point in time at which the output of its predecessor drops to 0) to the point in time when its output potential reaches the threshold voltage $V_{TH}$ can be expressed by the equation:

$$V_{TH} = (I/C) * T_D, \qquad (7)$$

which yields the following equation for $T_D$.

$$T_D = V_{TH} * (C/I). \qquad (8)$$

The ring oscillator shown in FIG. 5 has a time period of $3*T_D$. In other words, it takes $3*T_D$, from a point in time when output voltage O0 of the delay circuit 511 is $V_{TH}$ to the next point in time when output voltage O0 reaches threshold voltage $V_{TH}$ again. Note that time $T_D$ is proportional to C and inversely proportional to I, as indicated by equation (8). Thus, the oscillation period of the ring oscillator shown in FIG. 5 can be varied by varying the sum of the capacitances of capacitors C9, CA and CB, and/or the value of current I through MOS transistor MP2.

The use of switching elements to vary the capacitance results in the introduction of the parasitic capacitance of the switching elements into the delay circuit, leading to an increase in the minimum value of delay length. As a result, the upper limit of the oscillation frequency of a ring oscillator incorporating such a delay circuit is reduced.

In some embodiments of the present invention, a delay circuit with a minimal load capacitance is presented leading to a lower minimum delay value. Thus, a higher range of operating frequencies is possible for a ring oscillator incorporating a delay circuit according to embodiments of the present invention.

Figure 7:
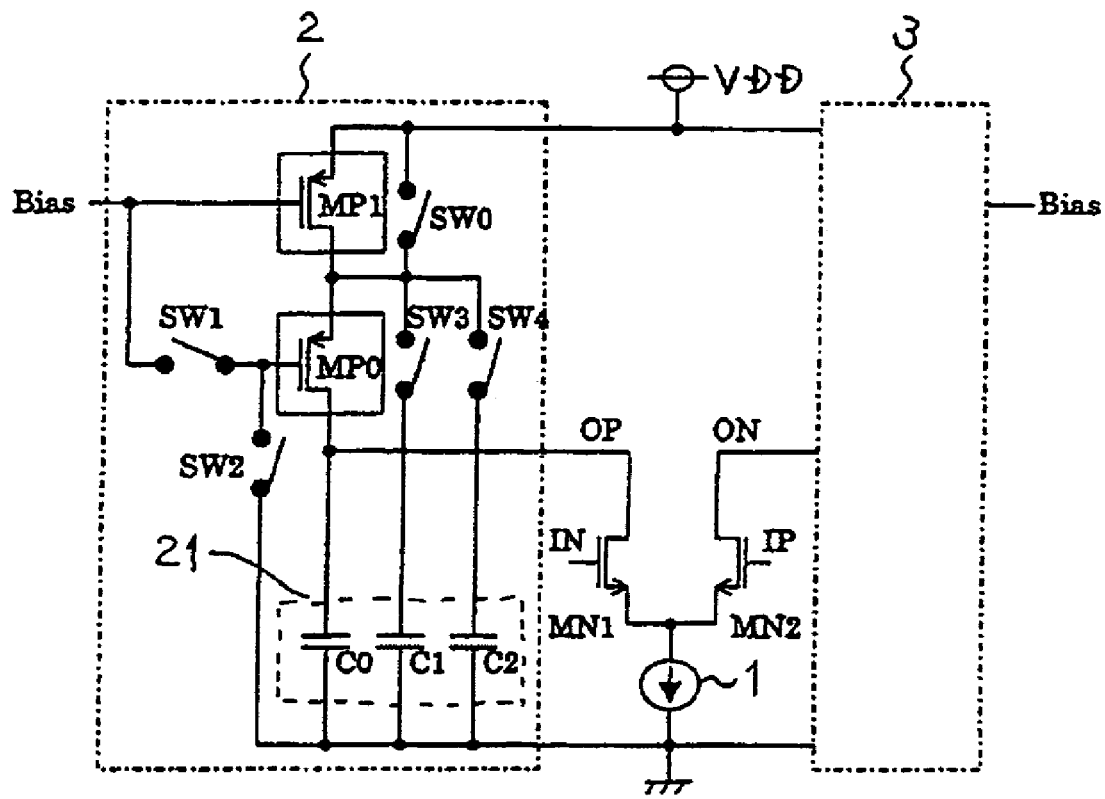
FIG. 7 shows a circuit diagram showing an arrangement of an exemplary delay circuit, according to embodiments of the present invention.

FIG. 7 shows a circuit diagram showing a delay circuit according to some embodiments of the present invention. In some embodiments, as shown in FIG. 7, a differential delay circuit may be used comprising of a differential pair of N-type MOS transistors MN1 and MN2, a current source 1, and a pair of delay setting sections 2 and 3 for setting delay length. Delay setting sections 2 and 3 are disposed symmetrically and can have the same circuit arrangement. Accordingly, the internal arrangement of the delay setting section 3 has not been shown and follows from the description of delay section 2. MOS transistors MN1 and MN2, in delay section 2, are supplied with inputs IN and IP respectively at their gates. The sources of MN1 and MN2 are coupled to each other and the connection grounded via current source 1. MOS transistors MN1 and MN2 provide outputs OP and ON respectively at their drains.

As shown in FIG. 7, delay setting section 2 also includes capacitor set 21 with capacitors C0, C1 and C2, two P-type transistors MP0 and MP1 which also serve as resistors when charging or discharging capacitor set 21, and switches SW0–SW4. Switches SW0–SW2 selectively enable MOS transistors MP0 or MP1. Switches SW3 and SW4 are coupled in series to capacitors C1 and C2 respectively, and allow capacitors C1 and C2 to be selectively coupled in parallel with capacitor C0. Capacitor C0 is coupled to the drains of MOS transistors MN1 and MP0 at one end and grounded at the other end. Capacitor C1 is coupled to the junction of MOS transistors MP0 and MP1 through switch SW3 at one end and grounded at the other end. Capacitor C2 is coupled to the junction of MOS transistors MP0 and MP1 through switch SW4 at one end and grounded at the other end.

In FIG. 7, MOS transistors MP0 and MP1 are coupled in series (the drain of MP1 is coupled to the source of MP0) and coupled to a power supply VDD at one end, and to capacitor C0 and the drain of MOS transistor MN1 at the other end. Additionally, the gate of MOS transistor MP0 can be grounded via switch SW2, Bias voltage "Bias" is applied to the gate of MP1 and can be applied to the gate of MP0 using switch SW1. Note that both the drain and source of MOS transistor MP1 are coupled to switch SW0, effectively short-circuiting MP1 when the switch is turned on (closed). The resistance of MOS transistors MP0 and MP1 is a function of input bias voltage, Bias.

Figure 8:
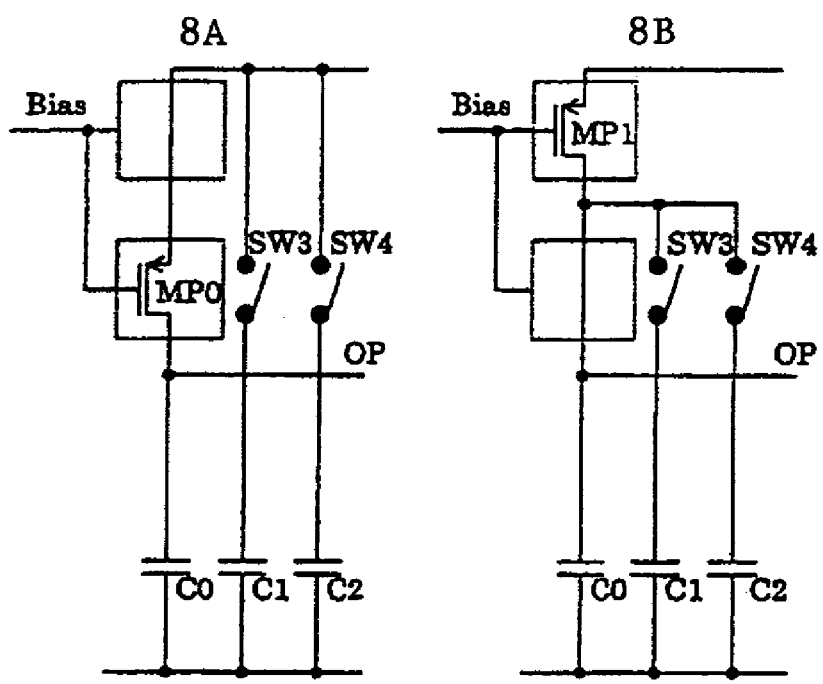
FIGS. 8(A) and 8(B) illustrate the operation of the exemplary delay circuit shown in FIG. 7, according to embodiments of the present invention.

A delay circuit according to some embodiments of the present invention, as shown in FIG. 7, can operate in two modes as shown in FIG. 8(A) and FIG. 8(B), respectively. FIG. 8(A) and FIG. 8(B) are simplified circuit diagrams of the delay circuit section 2 that result from certain configurations of the switches in FIG. 7.

In a first operation mode, switches SW0 and SW1 are turned on, and the switch SW2 is turned off, as shown in FIG. 8(A). With SW0 turned on, the source and drain of MOS transistor MP1 are short-circuited, so that the source of MOS transistor MP0 can be considered as coupled to power supply VDD. In this mode, delay length of the circuit is determined by the resistance of MOS transistor MP0 and load capacitance of capacitor C0. Note that since switches SW3 and SW4 are not coupled to the drain of MOS transistor MN1, they are not loads on MN1.

In a second operation mode, switches SW0 and SW1 are turned off, and the switch SW2 is turned on, as shown in FIG. 8(B). When switch SW2 is turned on, the gate of MOS transistor MP0 is grounded, so that the drain and source of MP0 can be considered to be short-circuited. Therefore, in this mode, the delay length of the delay circuit is determined by the resistance of the MOS transistor MP1 and a load capacitance, which is a sum of the capacitance of capacitor C0 and a controllable capacitance determined by the capacitances of capacitors C1 and C2 based on the on/off state of switches SW3 and SW4. In this mode, the delay circuit may have the capacitors C1 and C2 as loads thereon, as shown in FIG. 8(B).

Note that according to embodiments of the present invention as shown in FIG. 8(A), in the first operational mode, switches SW3 and SW4, which select capacitors C1 and C2 respectively, are not coupled to the output terminal of the delay circuit. Thus, any additional parasitic capacitance that would otherwise result from the use of switches SW3 and SW4 is not added to the delay circuit. Therefore, the minimum load capacitance of the exemplary delay circuit configuration shown in FIG. 7 and FIG. 8(A) can be lower than that of conventional delay circuits, such as the circuit shown in FIG. 1. A delay circuit according to embodiments of the present invention can have a minimum delay amount smaller than that of a conventional circuit.

In some embodiments, the delay circuit may be arranged so that MOS transistor MP1 is short-circuited. In some embodiments, MOS transistor MP0, may be short-circuited by using a switch provided in parallel with the MOS transistor MP0, instead of switch SW2. In some embodiments, a capacitance, such as C0, can be provided in the form of a wiring capacitance, or the parasitic capacitance of a transistor. In some embodiments, an additional capacitor with a series-coupled switch may be provided in parallel with capacitor C1 and series-coupled switch SW3. In some embodiments, an additional capacitor with a series-coupled switch may be provided in parallel with capacitor C2 and the series-coupled switch SW4. In some embodiments, a fixed capacitor that is not controlled by a switch may be loaded in parallel with C1 or C2. In some embodiments, the positions of the capacitor and its series-coupled switch may be interchanged, so that the switch, rather than the capacitor, is grounded.

In some embodiments, the exemplary delay circuit of FIG. 7 may be used in the ring oscillator of FIG. 2. Four delay circuits 211–214 of the type shown in FIG. 7 may be cascaded to form a ring oscillator with the output signal of the back-end delay circuit being fed back to be the input signal of the front-end delay circuit, according to embodiments of the present invention.

Figure 9:
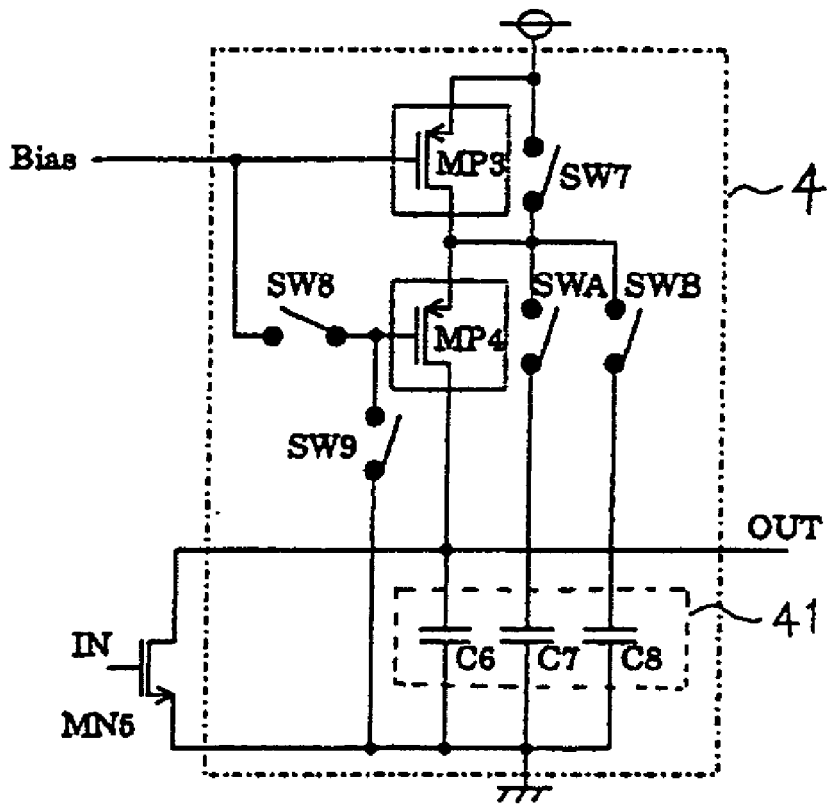
FIG. 9 shows a circuit diagram of another arrangement of an exemplary delay circuit, according to the embodiments of the present invention.

FIG. 9 shows a circuit diagram of a single-ended delay circuit according to some embodiments of the present invention. As shown in FIG. 9, the delay circuit includes N-type MOS transistor MN5 and delay setting section 4. In some embodiments, delay setting section 4, in turn, includes capacitor set 41 with capacitors C6, C7, and C8; P-type transistors MP3 and MP4 serving as resistors for charging or discharging capacitor set 41; and switches SW7–SW9, SWA, and SWB. Switches SW7–SW9 are arranged to selectively enable one of MOS transistors MP3 or MP4. Switches SWA and SWB are coupled in series to the capacitors C7 and C8, respectively, and may be used to selectively couple capacitors C7 and C8 respectively in parallel with capacitor C6.

As shown in the exemplary circuit in FIG. 9, capacitor C6 is also coupled to the drains of MOS transistors MN5 and MP4 at one end and grounded at the other end. Capacitors C7 and C8 are coupled (through switches SWA and SWB respectively) to the junction of MOS transistors MP3 and MP4 at one end and grounded at the other end. Series-coupled MOS transistors MP3 and MP4 are coupled to power supply VDD at one end, and to capacitor C6 and the drain of MOS transistor MN5 at the other end. Bias voltage "Bias" is applied to the gate of MOS transistor MP3, and to the gate of MP4 using switch SW8. Current in the exemplary circuit shown in FIG. 9, is controlled by MOS transistors MP3 and MP4 based on the value of bias voltage Bias, applied to the gates of MOS transistors MP3 and MP4. Note that both the drain and source of MOS transistor MP3 are coupled to switch SW7, effectively short-circuiting MP3 when the switch is turned on (closed). Note also that switch SW9 may be used to ground the gate of MP4.

Figure 10:
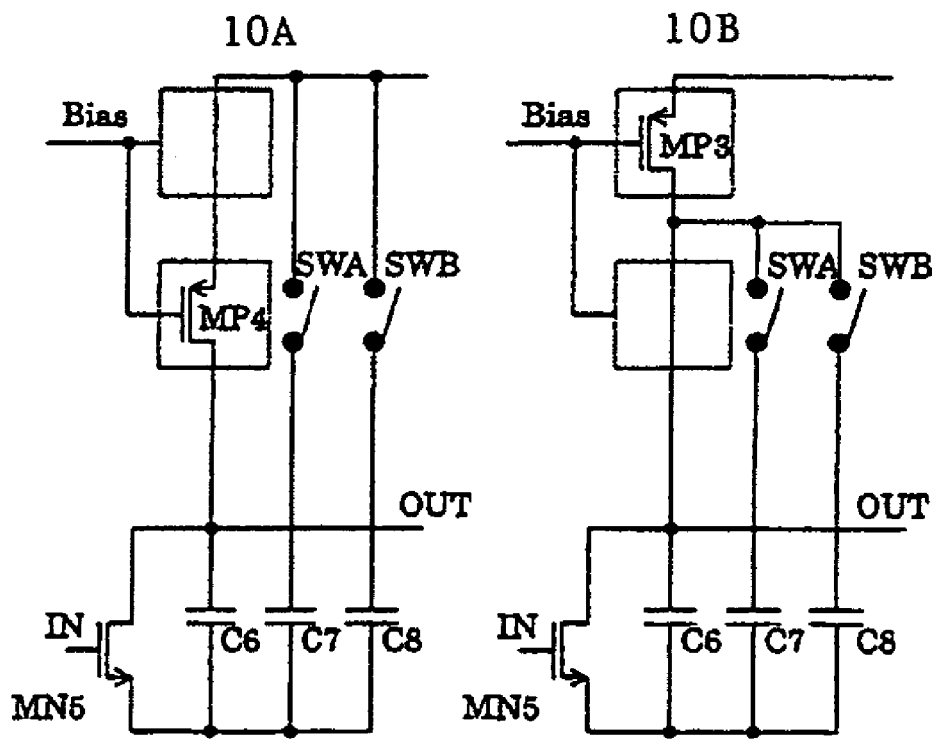
FIGS. 10(A) and 10(B) illustrate the operation of the exemplary delay circuit shown in FIG. 9.

A delay circuit according to some embodiments of the present invention, as shown in FIG. 9, can operate in two modes as shown in FIG. 10(A) and FIG. 10(B), respectively. FIG. 10(A) and FIG. 10(B) are simplified diagrams of the circuit of FIG. 9 resulting from certain configurations of the switches in FIG. 9.

In a first operation mode, switches SW7 and SW8 are turned on, and switch SW9 is turned off. The resulting circuit is shown in FIG. 10(A). In this mode, with switch SW7 turned on, MOS transistor MP3 is short-circuited. Thus, the source of MOS transistor MP4 is coupled to power supply VDD. Accordingly, delay length is determined by the current passing through MOS transistor MP4 and load capacitance of capacitor C6. Note that switches SWA and SWB are not coupled to the drain of MOS transistor MN5, which is an output terminal of the delay circuit. Thus, switches SWA and SWB are not loads on MOS transistor MN5.

In a second operation mode, the switches SW7 and SW8 shown in FIG. 9 are turned off, and the switch SW9 is turned on. The resulting circuit is shown in FIG. 10(B). In this mode, switch SW9 grounds the gate of the MOS transistor MP4, so that the drain and source of the MOS transistor MP4 can be considered to be short-circuited. Accordingly, delay length is determined by the current passing through MOS transistor MP3 and the load capacitance. The load capacitance is the sum of the capacitance of capacitor C6 and a controllable capacitance determined by the capacitances of the capacitors C7 and C8 based on the on/off state of switches SWA and SWB.

Note that according to embodiments of the present invention as shown in FIG. 10(A), in the first operational mode, switches SWA and SWB, which select capacitors C7 and C8 respectively, are not coupled to the output terminal of the delay circuit. Thus, any additional parasitic capacitance that would otherwise result from the use of switches SWA and SWB is not added to the delay circuit. Therefore, the minimum load capacitance of the exemplary delay circuit configuration shown in FIG. 9 and FIG. 10(A) can be lower than that of conventional delay circuits, such as the circuit shown in FIG. 4. A delay circuit according to embodiments of the present invention can have a minimum delay amount smaller than that of a conventional circuit.

In some embodiments, the delay circuit may be arranged so that MOS transistor MP3 is short-circuited, in a manner similar to MP4. In some embodiments, MOS transistor MP4 may be short-circuited by using a switch provided in parallel with transistor MP4, instead of switch SW9. In some embodiments, a capacitance, such as C6, can be provided in the form of a wiring capacitance, or the parasitic capacitance of a transistor. In some embodiments, an additional capacitor with a series-coupled switch may be provided in parallel with capacitor C7 and series-coupled switch SWA. In some embodiments, an additional capacitor with a series-coupled switch may be provided in parallel with capacitor C8 and the series-coupled switch SWB. In some embodiments, a fixed capacitor that is not controlled by a switch may be loaded in parallel with C7 or C8. In some embodiments, the positions of the capacitor and its series-coupled switch may be interchanged, so that the switch, rather than the capacitor, is grounded.

In some embodiments, the exemplary delay circuit of FIG. 9 may be used in the ring oscillator of FIG. 5. Three delay circuits 511–513 of the type shown in FIG. 9 may be cascaded to form a ring oscillator with the output signal of back-end delay circuit 513 being fed back to be the input of front-end delay circuit 511, according to some embodiments of the present invention.

Other embodiments of the present invention may make use of many types of delay circuits and methods to carry out the delay circuit or oscillator functions. In some embodiments, the embodiments described could be incorporated into an integrated circuit. The embodiments described above are exemplary only and are not intended to be limiting. The operations, stages, and procedures described above and illustrated in the accompanying drawings are sufficiently disclosed to permit one of ordinary skill in the art to practice the invention. One skilled in the art may recognize various possible modifications that are intended to be within the spirit and scope of this disclosure. As such, the invention is limited only by the following claims.

The invention claimed is:

1. A delay circuit, comprising:
    a capacitor set including a first capacitor and at least one second capacitor capable of being coupled in parallel with the first capacitor;
    a first switching configuration to selectively enable one of at least two transistors coupled in series;
    a second switching configuration to enable the charging or discharging of at least one of first capacitor or second capacitor using one of the at least two transistors in accordance with an input signal; and
    wherein the first capacitor is used when one of the at least two transistors is enabled, and, the first capacitor and the at least one second capacitor are used when another of the at least two transistors is enabled.

2. The delay circuit of claim 1, wherein the at least two transistors serve as resistors.

3. The delay circuit of claim 2, wherein a resistance of an enabled transistor is varied by varying the value of a bias voltage applied to the gate of the transistor.

4. The delay circuit of claim 1, wherein the at least two transistors serve as current sources.

5. The delay circuit of claim 1, wherein the second switching configuration to enable charging or discharging of at least one of first capacitor or second capacitor using one of the at least two transistors allows the state of at least one of first capacitor or second capacitor to be changed between a charged state and a discharged state.

6. The delay circuit of claim 1, wherein the first switching configuration selectively enables one of the at least two transistors by breaking a short-circuit used to disable the transistor.

7. The delay circuit of claim 1, wherein the first switching configuration to selectively enable one of at least two transistors coupled in series does not load the output terminal of the delay circuit.

8. A sequence of an integral number of delay circuits according to claim 1 coupled in series to form an oscillator, wherein the output signal of each delay circuit is fed to the next delay circuit in sequence and the output signal of the last delay circuit in the sequence is fed back to the first delay circuit in the sequence.

9. An oscillator as in claim 8, fabricated in a monolithic integrated circuit, comprising input terminals to the integrated circuit for receiving power, an input signal, means for grounding, and with at least one output node.

10. A delay circuit, comprising:
    a capacitor set including a first capacitor and at least one second capacitor capable of being coupled in parallel with the first capacitor;
    a first switching configuration to selectively enable one of at least two resistors coupled in series;
    a second switching configuration to enable the charging or discharging of at least one of first capacitor or second capacitor using one of the at least two resistors in accordance with an input signal; and
    wherein the first capacitor is used when one of the at least two resistors is enabled, and, the first capacitor and the at least one second capacitor are used when another of the at least two resistors is enabled.

11. The delay circuit according to claim 10, wherein the second switching configuration to enable-charging or discharging of at least one of first capacitor or second capacitor using one of the at least two resistors allows the state of at least one of first capacitor or second capacitor to be changed between a charged state and a discharged state.

12. The delay circuit according to claim 10, wherein the first switching configuration selectively enables one of the at least two resistors by breaking a short-circuit used to disable the resistor.

13. A sequence of an integral number of delay circuits according to claim 10 coupled in series to form an oscillator, wherein the output signal of each delay circuit is fed to the next delay circuit in sequence and the output signal of the last delay circuit in the sequence is fed back to the first delay circuit in the sequence.

14. A delay circuit, comprising:
    a capacitor set including a first capacitor and at least one second capacitor capable of being coupled in parallel with the first capacitor;
    a first switching configuration to selectively enable one of at least two current sources coupled in series;
    a second switching configuration to enable the charging or discharging of at least one of first capacitor or second capacitor using one of the at least two current sources in accordance with an input signal; and
    wherein the first capacitor is used when one of the at least two current sources is enabled, and, the first capacitor and the at least one second capacitor are used when another of the at least two current sources is enabled.

15. The delay circuit according to claim 14, wherein the second switching configuration to enable charging or discharging of at least one of first capacitor or second capacitor using one of the current sources allows the state of at least one of first capacitor or second capacitor to be changed between a charged state and a discharged state.

16. The delay circuit according to claim 14, wherein the first switching configuration selectively enables one of the at least two current sources by breaking a short-circuit used to disable the current source.

17. A delay circuit fabricated in a monolithic integrated circuit, comprising input terminals to the integrated circuit for receiving power, an input signal and having a ground, an at least one internal signal node, and at least one output node, comprising:
- a capacitor set including a first capacitor and at least one second capacitor capable of being coupled in parallel with the first capacitor;
- a first switching configuration to selectively enable one of at least two transistors coupled in series;
- a second switching configuration to enable the charging or discharging of at least one of first capacitor or second capacitor using one of the at least two transistors in accordance with an input signal; and
- wherein the first capacitor is used when one of the at least two transistors is enabled, and, the first capacitor and the at least one second capacitor are used when another of the at least two transistors is enabled.

18. The delay circuit of claim 17, wherein the delay circuit forms a functional element of a larger component incorporated into the monolithic integrated circuit.

19. The delay circuit of claim 17, where the at least two transistors serve as resistors or current sources.

20. A delay circuit, comprising:
- a capacitor set including a first capacitor and at least one second capacitor capable of being connected in parallel with the first capacitor;
- means for selectively enabling one of at least two transistors connected in series;
- means for charging or discharging at least one of first capacitor or second capacitor using one of the at least two transistors in accordance with an input signal; and
- wherein the first capacitor is used when enabling means selects one of the at least two transistors, and, the first capacitor and the at least one second capacitor are used when the enabling means selects another of the at least two transistors.

21. The delay circuit of claim 20, wherein the at least two transistors serve as resistors.

22. The delay circuit of claim 20, wherein a resistance of an enabled transistor is varied by varying the value of a bias voltage applied to the gate of the transistor.

23. The delay circuit of claim 20, wherein the at least two transistors serve as current sources.

24. The delay circuit of claim 20, wherein means for charging or discharging of at least one of first capacitor or second capacitor using one of the at least two transistors further comprises means for switching the state of at least one of first capacitor or second capacitor between a charged state and a discharged state.

25. The delay circuit of claim 20, wherein the means for selectively enabling a transistor further comprises breaking the short-circuit used to disable the transistor.

26. The delay circuit of claim 20, wherein the means for selectively enabling one of at least two transistors connected in series does not load the output of the delay circuit.

27. A sequence of an integral number of delay circuits according to claim 20 connected in series to form an oscillator, wherein the output signal of each delay circuit is fed to the next delay circuit in sequence and the output signal of the last delay circuit in the sequence is fed back to the first delay circuit in the sequence.

28. An oscillator as in claim 27, fabricated in a monolithic integrated circuit, comprising input terminals to the integrated circuit for receiving power, an input signal, means for grounding, and with at least one output node.

29. A method to vary the time period of a delay circuit comprising:
- using a first switching configuration to selectively enable one of at least two transistors coupled in series;
- using a second switching configuration to enable the charging or discharging of at least one of a first capacitor, or at least one of one or more additional capacitors coupled in parallel to the first capacitor, using one of the at least two transistors in accordance with an input signal; and
- varying the capacitance by enabling the first capacitor when one of the at least two transistors is enabled, and, by enabling the first capacitor and at least one additional capacitor from among the at least one of one or more additional capacitors coupled in parallel to the first capacitor, when another of the at least two transistors is enabled.

30. The method of claim 29, wherein using the first switching configuration to selectively enable one of at least two transistors connected in series is accomplished without loading the output of the delay circuit.

* * * * *